United States Patent [19]

Crocker

[11] Patent Number: 4,477,857

[45] Date of Patent: Oct. 16, 1984

[54] PRINTED CIRCUIT FUSE

[75] Inventor: Angus M. Crocker, Menlo Park, Calif.

[73] Assignee: GTE Network Systems Corporation, Phoenix, Ariz.

[21] Appl. No.: 453,645

[22] Filed: Dec. 27, 1982

[51] Int. Cl.³ .............................................. H02H 9/06
[52] U.S. Cl. ..................................... 361/119; 361/118; 361/56; 361/55; 361/111; 361/124; 361/104; 361/399; 361/402; 179/170 R
[58] Field of Search .................... 361/119, 118, 56, 55, 361/110, 111, 124, 104, 397, 399, 400, 402; 337/295–297, 290; 179/1 PC, 98

[56] References Cited

U.S. PATENT DOCUMENTS

| | | | |
|---|---|---|---|
| 4,160,210 | 7/1979 | Molinari | 361/119 X |
| 4,191,985 | 3/1980 | Phillips, Jr. | 361/55 X |
| 4,317,154 | 2/1982 | Passarella | 361/119 |
| 4,379,318 | 4/1983 | Ootsuka | 361/104 |
| 4,394,639 | 7/1983 | McGalliard | 361/104 X |

Primary Examiner—Patrick R. Salce
Attorney, Agent, or Firm—Russell A. Cannon

[57] ABSTRACT

Apparatus for preventing a fire in electrical equipment when a relatively constant overvoltage condition appears on an input line comprises a meltable fuse in the line and a surge arrestor connected between the equipment side of the fuse and ground. The surge arrestor is physically located adjacent the fuse for melting the latter and open circuiting the line when the overvoltage condition is present for greater than a net prescribed time interval. In a preferred embodiment, the line adjacent the electrical equipment is a printed conductive line on one side of a circuit board, with the fuse comprising a gap in the printed line that is bridged with a bead of solder. The surge arrester is located under the solder bridge, with one of its leads extending through the board and connected to the printed conductor within the solder bridge.

6 Claims, 3 Drawing Figures

PRINTED CIRCUIT FUSE

BACKGROUND OF INVENTION

This invention relates to protection of printed circuit (PC) structures and more particularly to an in-line printed circuit thermal fuse which is operated by heat from an adjacent component on a PC board to prevent a fire in electrical equipment. Surge arrestors such as gas tubes and carbon block protectors are required in telephone systems whenever telephone company equipment is located on or in a subscriber's premises. The are primarily used to protect a subscriber from an electrical shock which could occur from an overvoltage on the telephone lines that is caused by lightning. Since the surge arrestors protect the telephone equipment as well as the subscriber, they are also used to protect equipment such as line repeaters and subscriber terminals at other locations in the telephone system. The carbon block protector is commonly used in outside applications, e.g., where telephone wires enter a building. It consists of closely spaced carbon electrodes which discharge across an air gap at atmospheric pressure under an overvoltage. Gas tubes are also employed in such applications and are often mounted in PC boards which are made of fiberglass. Such protectors operate satisfactorily for momentary overvoltages of short duration on the telephone lines. If a high voltage power cross occurs (i.e., from a high voltage power line falling across a telephone line), however, sustained high currents in the surge arrestor may generate sufficient heat to ignite a PC board and cause an equipment fire. In order to prevent such an occurrence, a fail safe arrangement may be incorporated into the surge arrestor. A common type of fail safe arrangement comprises a lead pellet which holds a spring-loaded metal cylinder above a metal base. A sustained overvoltage on the device fires the protector continuously and heats it sufficiently to melt the lead pellet. The spring then moves the cylinder into contact with the base to permanently provide a low resistance metallic path to ground. Similar structures are combined with gas tube surge arrestors. An actuated device of such design provides a continuous short circuit across the telephone lines. Additionally, such fail safe protectors are relatively large and expensive and need not be duplicated in field equipment such as line repeaters that are mounted away from a residence on telephone poles or in a housing on a pedestal, or in the same circuit with mandatory building protection. An object of this invention is the provision of improved method and apparatus for protecting electrical equipment.

DESCRIPTION OF PREFERRED EMBODIMENTS

Figure 1:
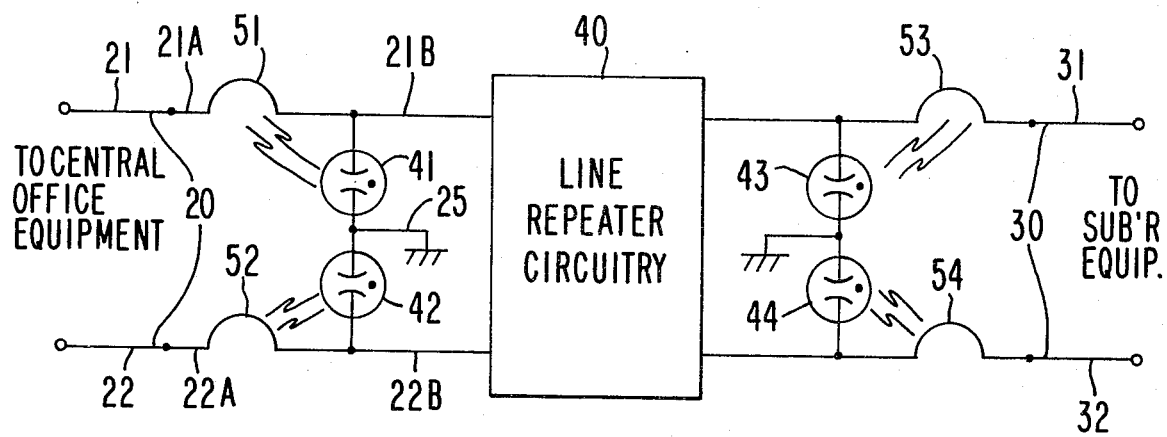
FIG. 1 is a schematic circuit representation of telephone line repeater equipment embodying this invention.

Referring now to FIG. 1, line repeater equipment in a carrier subscriber telephone system is connected on cable pair 20 to central office equipment and on cable pair 30 to carrier subscriber equipment which may be mounted on a telephone pole or in a housing on a pedestal. Since these cable pairs may extend over considerable distances, momentary or continuous high voltage conditions may be impressed on them by lightning or by a high voltage power line falling across them, respectively. In accordance with this invention, the repeater equipment 40 is protected from such a condition by gas tubes 41-44 and associated in-line metable fuse means 51-54 in associated lines of the cable pairs. The gas tubes are located adjacent to associated fuses and are selected to conduct for a high voltage condition such as a 350 volt potential between one of the lines and ground. When lightning causes such a momentary high voltage condition on line 22, for example, the tube 42 momentarily conducts for bypassing associated line current to ground and away from the repeater circuitry for protecting the latter. If a power cross occurs on lines 21-22, for example, the gas tubes 41-42 fire and continue to conduct. When the gas tubes heat up sufficiently to melt the associated fuses 51-52 and open circuit the lines 21-22, line current is interrupted and the gas tubes are allowed to cool before they can heat up structures supporting them enough to cause a fire in the repeater.

Figure 2:
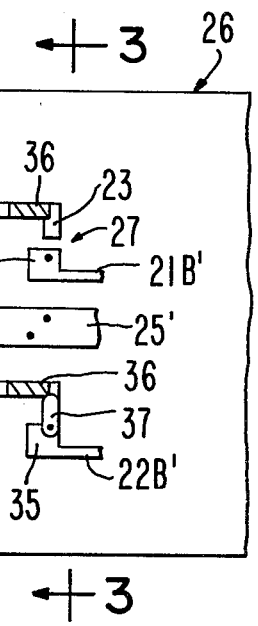
FIG 2 is a top view of a PC board, 26, supporting electrical circuitry in FIG. 1, and embodying this invention.
Figure 3:
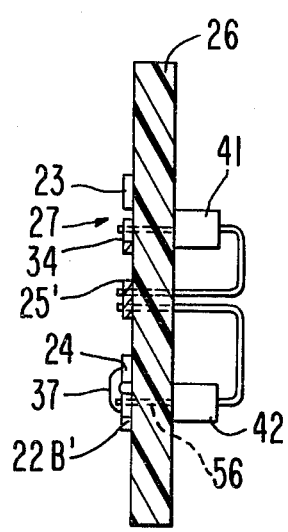
FIG. 3 is a section view of the circuit board 26 taken along line 3—3 in FIG. 2.

Referring now to FIG. 2, a plug-in printed circuit board mounted protector structure for protecting line repeater equipment and being located in a repeater housing comprises conductor lines 21A', 21B', 22A', and 22B' and a grounded bus line 25' which are printed on a fiberglass circuit board 26. The ends 21C, 22C and 25C of these printed lines are gold-plated for plug-in connection to associated wires in FIG. 1. Conductive pads 34 and 35 are formed on ends of the lines 21B' and 22B', with a gap such as gap 27 between them and the tabs 23 and 24 on the ends of associated printed lines. The other ends of lines 21B' and 22B' are connected to electrical line repeater circuitry 40 in FIG. 1. The surface areas of these pads are preferably much greater than that of tabs 23-24.

The gas tubes 41-42 are located under the associated pads and gaps, with leads thereof extending through plated-through holes in the board. One lead of each gas tube is soldered to the ground bus line 25'. The other leads are soldered to the associated pads at points thereon that are adjacent the associated gap. The meltable fuse 52 is formed in series in the lines 22A' and 22B' by forming a solder bead that is firmly electrically connected to and which completely bridges the gap between the tab 24 and pad 35. This solder bead may be formed by hand with a soldering iron. A small amount of solder resist 36 is placed on the lines 21A'—22A' adjacent the tabs there for preventing solder moving up these lines while forming a solder bead or bridge. Although the solder bead is preferably made to extend over the end of the gas tube lead 56 in the pad 35, it preferably covers only a small area of pad 35. The full surface area of the pad is, however, wetted with solder. A solder bridge that is the fuse means 51 is also formed over the gap 27 in a completed assembly.

In operation, consider that a power cross produces a sustained 500 volt potential on line 22, for example. This causes the 350 volt gas tube 42 to ionize for bypassing a heavy line current away from line 22 and to ground. As the gas tube 42 heats up from the current in it, heat is conducted through lead 56 and the circuit board to pad 35 and the solder bridge 37. If the high voltage is present on line 22 for more than a prescribed time interval, which has been found to be approximately 30 seconds, the gas tube 42 overheats sufficiently to melt and reflow the solder on the pad 35 as well as that forming the solder bridge 37. Liquid surface tension and miniscus then sucks or pulls the molten solder and causes it to spread over the pad 35 which is sufficiently large to operate as a solder well which gathers in the molten solder, drawing it away from the solder bridge and thus opening the lines 22A–22B. This shuts off the gas tube 42 before it overheats sufficiently to cause a fire such as by igniting the circuit board 26.

In an embodiment of this invention that was built and satisfactorily operated, the pads 34–35 measured 0.250 inch×0.250 inch and the tabs 23–24 were 0.100 inch wide, with a 0.020 inch gap between these tabs and the associated pads. The gas tubes 41–44 were PM 350 tubes manufactured by Siemens. In this printed circuit protector apparatus, a solder bridge or meltable fuse means was satisfactorily operated for open circuiting the associated printed conductor line in approximately 30 seconds.

Although this invention is described in relation to preferred embodiments thereof, variations and modifications will occur to those skilled in the art. By way of example, surge arrestors other than gas tubes may be employed here. Also, the surge arrestors may be mounted on the same side of a circuit board as the solder bridge. Further, the meltable fuse means may be actuated by circuit elements other than surge arrestors which pass an electrical current and are heated thereby. Further, if intermittent high voltage conditions on the cable pair cause gas tubes to cycle on and off at a rate in which the on-time is greater than the off-time, then this structure will integrate this operation so as to melt a solder bridge before the gas tube overheats sufficiently to cause a fire. And if a high line voltage condition is removed before the predetermined time interval is exceeded, then the associated fuse means will not open. Additionally the protector embodying this invention operates satisfactorily with the circuit board 26 mounted in a horizontal position or in an upright vertical position in which the pads 34–35 are below the tabs 23–24. Alternatively, the pads and tabs may be in the same plane when board 26 is in a vertical orientation. The apparatus is preferably not operated, however, with the pads positioned above the tabs. The scope of this invention is therefore to be determined from the appended claims rather than from the aforementioned detailed descriptions of preferred embodiments thereof.

What is claimed is:

1. The method of protecting electrical equipment that is connected to a printed line conductor on a printed circuit board from a generally sustained high voltage on the line for greater than a predetermined time interval, comprising the steps of:

forming the printed line conductor with a gap between first and second lengths thereof and a pad on the end of one length thereof that defines the gap, said gap presenting an open circuit in the line lengths and said pad having a width and surface area which are greater than those of the other length of line on the other side of the gap;

wetting the pad with solder;

forming a solder bridge between the pad and the adjacent end of the other length of line conductor with a minimum amount of solder on the pad;

electrically connecting a surge arrestor between one of the lengths of line conductor and one of a second line and a ground reference potential, the surge arrestor breaking down and conducting for a line voltage which is greater than a prescribed voltage for bypassing current on the line lengths through the surge arrestor, with the surge arrestor being heated by the bypassed line current; and locating the surge arrestor proximate the pad and bridge so that such a high voltage condition that is generally sustained on the line for greater than a prescribed net time interval heats the surge arrestor sufficiently to melt the solder bridge whereby the melted solder is drawn up onto the pad and away from the gap for presenting an open circuit in the line which interrupts line current and thereby protects the electrical equipment.

2. The method according to claim 1 comprising the steps of physically and electrically connecting one terminal of the surge arrestor to an interior point of the pad that is adjacent the gap and forming the solder bridge over the one terminal of the surge arrestor that is connected to the pad.

3. The method according to claim 2 comprising the step of locating the surge arrestor and pad on opposite sides of the printed circuit board with the surge arrestor overlapping at least portions of the pad and solder bridge.

4. Apparatus comprising:

a printed circuit board, first and second line conductors printed on said board with one ends thereof spaced apart to form a gap therebetween that presents an open circuit in series in the lines, said first line having the other end thereof electrically connected to electrical equipment, said one end of said first line having a pad thereon with an edge thereof defining the gap and a width and surface area that are greater than those of said one end of said second line;

a solder bridge electrically connected between said pad and the adjacent one end of said second line with a minimum amount of solder on the pad; and a surge arrestor on said circuit board and proximate said pad and solder bridge and electrically connected between one of said first and second lines and one of a third line and a ground reference potential, said surge arrestor breaking down and conducting for a voltage on said first and second lines which is greater than a prescribed voltage for bypassing current on said lines through the surge arrestor, with the surge arrestor being heated by the bypassed line current, whereby a high voltage condition that is generally sustained on the line for greater than a prescribed net time interval heats the surge arrestor sufficiently to melt the solder bridge whereby the melted solder is drawn up onto the pad and away from the gap for presenting an open circuit in said first and second lines which interrupts line current and thereby protects the electrical equipment.

5. Apparatus according to claim 4 wherein said surge arrestor has one terminal physically and electrically connected to an interior point of said pad and wherein said solder bridge extends over said one terminal.

6. Apparatus according to claim 5 wherein said surge arrestor and pad are located on opposite sides of said board with the surge arrestor overlapping at least portions of the pad and solder bridge.

* * * * *